(12) United States Patent
Takeuchi et al.

(10) Patent No.: US 11,177,353 B2
(45) Date of Patent: Nov. 16, 2021

(54) SILICON CARBIDE SEMICONDUCTOR DEVICE, AND MANUFACTURING METHOD OF THE SAME

(71) Applicants: DENSO CORPORATION, Kariya (JP); TOYOTA JIDOSHA KABUSHIKI KAISHA, Toyota (JP)

(72) Inventors: Yuichi Takeuchi, Kariya (JP); Ryota Suzuki, Toyota (JP); Tatsuji Nagaoka, Nagakute (JP); Sachiko Aoi, Nagakute (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/427,413

(22) Filed: May 31, 2019

(65) Prior Publication Data

US 2019/0288074 A1 Sep. 19, 2019

Related U.S. Application Data

(63) Continuation of application No. PCT/JP2017/044580, filed on Dec. 12, 2017.

(30) Foreign Application Priority Data

Dec. 12, 2016 (JP) .............................. JP2016-240558

(51) Int. Cl.
*H01L 29/16* (2006.01)
*H01L 21/02* (2006.01)
*H01L 29/06* (2006.01)
*H01L 29/423* (2006.01)
*H01L 29/66* (2006.01)

(Continued)

(52) U.S. Cl.
CPC .... *H01L 29/1608* (2013.01); *H01L 21/02529* (2013.01); *H01L 29/06* (2013.01); *H01L 29/0623* (2013.01); *H01L 29/0696* (2013.01); *H01L 29/12* (2013.01); *H01L 29/4236* (2013.01); *H01L 29/66068* (2013.01); *H01L 29/78* (2013.01); *H01L 29/7813* (2013.01)

(58) Field of Classification Search
CPC ......... H01L 29/16; H01L 21/02; H01L 29/06; H01L 29/423; H01L 29/66; H01L 29/78; H01L 29/1608; H01L 29/66068; H01L 29/0696; H01L 29/7813; H01L 29/0623; H01L 29/4236; H01L 21/02529
See application file for complete search history.

(56) References Cited

U.S. PATENT DOCUMENTS 9,391,136 B1 *  7/2016  Kawaguchi ........... H01L 29/475
2006/0065899 A1 *  3/2006  Hatakeyama ......... H01L 29/045
                                                    257/77

(Continued)

FOREIGN PATENT DOCUMENTS

WO     2018/008527 A1     1/2018

*Primary Examiner* — Sheng-Bai Zhu
(74) *Attorney, Agent, or Firm* — Posz Law Group, PLC

(57) ABSTRACT

In a guard ring section of a silicon carbide semiconductor device, an electric field relaxation layer for relaxing an electric field is formed in a surface layer portion of a drift layer, so that electric field is restricted from penetrating between guard rings. Thus, an electric field concentration is relaxed. Accordingly, a SiC semiconductor device having a required withstand voltage is obtained.

9 Claims, 10 Drawing Sheets

(51) Int. Cl.
*H01L 29/78* (2006.01)
*H01L 29/12* (2006.01)

(56) References Cited

U.S. PATENT DOCUMENTS

| | | |
|---|---|---|
| 2009/0200559 A1 | 8/2009 | Suzuki et al. |
| 2009/0212301 A1* | 8/2009 | Zhang ................. H01L 29/1608 257/77 |
| 2011/0062522 A1* | 3/2011 | Kato ................... H01L 27/0251 257/355 |
| 2013/0062619 A1* | 3/2013 | Henning ............ H01L 29/0661 257/77 |
| 2014/0175459 A1* | 6/2014 | Yamamoto ........ H01L 29/66068 257/77 |
| 2015/0129895 A1* | 5/2015 | Takeuchi ............ H01L 29/7827 257/77 |
| 2018/0151366 A1 | 5/2018 | Endo et al. |

* cited by examiner

SILICON CARBIDE SEMICONDUCTOR DEVICE, AND MANUFACTURING METHOD OF THE SAME

CROSS REFERENCE TO RELATED APPLICATION

The present application is a continuation application of International Patent Application No. PCT/JP2017/044580 filed on Dec. 12, 2017, which designated the U.S. and claims the benefit of priority from Japanese Patent Application No. 2016-240558 filed on Dec. 12, 2016. The entire disclosures of all of the above applications are incorporated herein by reference.

TECHNICAL FIELD

The present disclosure relates to a silicon carbide (hereinafter referred to as SiC) semiconductor device having a deep layer and a guard ring layer and to a manufacturing method of the same.

BACKGROUND

Conventionally, SiC has drawn attention as a raw material for a power device from which a high electric field breakdown strength can be obtained. As examples of a SiC power device, a MOSFET, a Schottky diode, and the like have been proposed.

SUMMARY

In a guard ring section of a silicon carbide semiconductor device, an electric field relaxation layer for relaxing an electric field is formed in a surface layer portion of a drift layer, so that electric field is restricted from penetrating between guard rings. Thus, an electric field concentration is relaxed. Accordingly, a SiC semiconductor device having a required withstand voltage is obtained.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
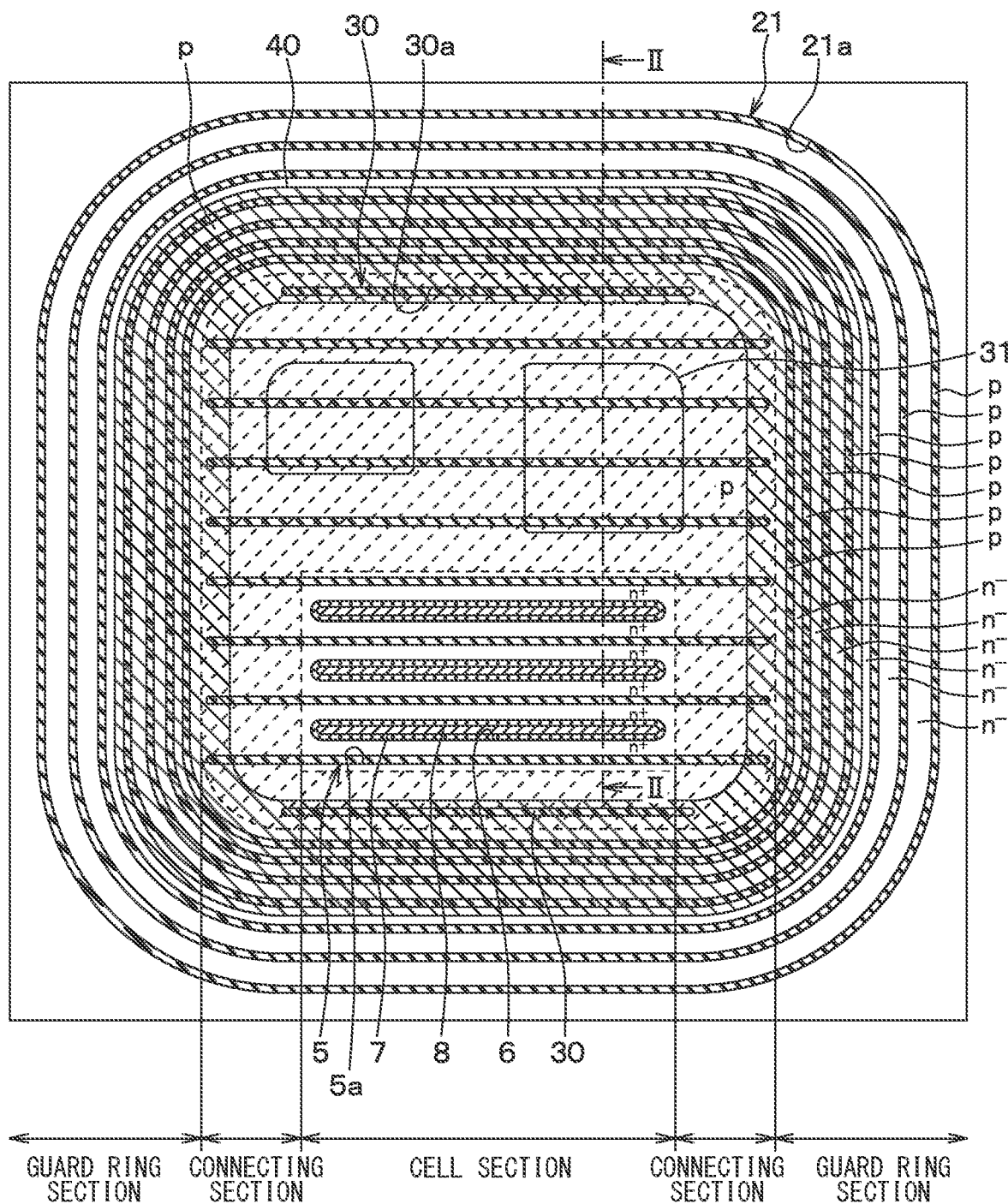
FIG. 1 is a view schematically showing a top layout of a SiC semiconductor device according to a first embodiment.

A SiC power device includes a cell section in which power elements such as MOSFETs or Schottky diodes are formed and a guard ring section surrounding the periphery of the cell section. Between the cell section and the guard ring section, a connecting section for connecting the cell section and the guard ring section is provided. On the top surface side of a semiconductor substrate in the connecting section, e.g., an electrode pad is provided. By recessing the top surface of the semiconductor substrate to form a recessed portion in an outer peripheral region including the guard ring section, a mesa portion is provided in which the cell section and the connecting section protrude into an island shape in the thickness direction of the substrate.

In a SiC semiconductor device including a power device having the configuration described above, when the distances between p-type deep layers formed in MOSFETs or the like in the cell section decrease with the miniaturization of the SiC semiconductor device, a depletion layer extending from each of the p-type deep layers reduces the substantial cross-sectional area of a current path. As a result, a JFET resistance increases, and therefore it is necessary to form, on an n-type drift layer, an n-type current dispersion layer having an impurity concentration higher than that of the n-type drift layer and extending to a position as deep as or deeper than those reached by the p-type deep layers and thus reduce the resistance.

However, when such an n-type current dispersion layer is formed, since the n-type current dispersion layer has a relatively high concentration, an electric field is likely to enter the space between p-type guard rings, resulting in a breakdown voltage reduction due to the concentration of the electric field. To prevent this, it can be considered to further reduce the distances between the individual guard rings and prevent the entrance of the electric field. However, due to the resolution of photolithography or the like, there is a limit to reducing the distances between the individual p-type guard rings, and therefore it is difficult to reduce the distances to, e.g., 0.5 µm or less. Accordingly, there is a concern that it may be impossible to respond to further miniaturization in the future.

A SiC semiconductor device is provided to have a structure which can prevent a breakdown voltage reduction due to electric field concentration when a current dispersion layer is formed.

According to an example embodiment, a silicon carbide semiconductor device includes: a cell section; and an outer peripheral section including a guard ring section surrounding an outer periphery of the cell section. Each of the cell section and the outer peripheral section includes: a substrate having a first conductivity type or a second conductivity type; a drift layer having the first conductivity type, arranged on a top surface side of the substrate, and having an impurity concentration lower than the substrate; and a current dispersion layer having the first conductivity type, arranged on the drift layer, and having an impurity concentration higher than the drift layer. The cell section further includes a vertical semiconductor element having: a second-conductivity-type layer arranged in the current dispersion layer with a stripe pattern shape; a first electrode electrically connected to the second-conductivity-type layer; and a second electrode electrically connected to a back surface side of the substrate. The vertical semiconductor element flows a current between the first electrode and the second electrode. The guard ring section includes a plurality of guard rings having the second conductivity type with a linear frame shape, arranged to extend from a top surface of the current dispersion layer, and surrounding the cell section. The guard ring section includes a recessed portion provided by a concavity of the current dispersion layer deeper than the cell section, and the cell section protrudes from the guard ring section in a thickness direction of the substrate to provide a mesa portion with an island shape. The guard ring section further includes an electric field relaxation layer having the second conductivity type with an impurity concentration lower than the guard rings, arranged in a surface layer portion of the drift layer, and extending from a boundary position between the mesa portion and the recessed portion toward an outside of an outer periphery of the mesa portion.

According to an example embodiment, a method for manufacturing a silicon carbide semiconductor device including a cell section and an outer peripheral section having a guard ring section surrounding an outer periphery of the cell section, the method includes: preparing a substrate having a first conductivity type or a second conductivity type; forming a drift layer, having the first conductivity type with an impurity concentration lower than the substrate, on a top surface side of the substrate; forming an electric field relaxation layer having the second conductivity type by ion-implanting an impurity having the second conductivity type into a surface layer portion of the drift layer; forming a current dispersion layer, having the first conductivity type with an impurity concentration higher than the drift layer, on the drift layer; forming a second-conductivity-type layer in the current dispersion layer in the cell section with a stripe pattern shape, and forming a plurality of guard rings, having the second conductivity type with a linear frame shape and surrounding the cell section, in the current dispersion layer in the guard ring section; forming a recessed portion, provided by a concavity of the current dispersion layer deeper than the cell section, in the guard ring section, and providing a mesa portion with an island shape by protruding the cell section from the guard ring section in a thickness direction of the substrate; forming a first electrode electrically connected to the second-conductivity-type layer; and forming a second electrode electrically connected to a back surface side of the substrate. In the forming of the electric field relaxation layer, the electric field relaxation layer is formed to extend from a boundary-to-be-formed position between the mesa portion and the recessed portion toward an outside of an outer periphery of the mesa portion.

Thus, in the surface layer portion of the drift layer, the electric field relaxation layer for electric field relaxation is formed to extend from the boundary position between the mesa portion and the recessed portion toward the outside of the outer periphery of the mesa portion. Thus, it is possible to prevent the entrance of an electric field into the space between the guard rings. This reduces electric field concentration, prevents the breakdown of an interlayer insulating film resulting from electric field concentration, and can prevent a breakdown voltage reduction. Therefore, it is possible to provide the SiC semiconductor device which allows an intended breakdown voltage to be obtained.

According to an example embodiment, a silicon carbide semiconductor device includes: a cell section; and an outer peripheral section including a guard ring section surrounding an outer periphery of the cell section. Each of the cell section and the outer peripheral section includes: a substrate having a first conductivity type or a second conductivity type; a drift layer having the first conductivity type with an impurity concentration lower than the substrate, and arranged on a top surface side of the substrate; and a current dispersion layer having the first conductivity type with an impurity concentration higher than the drift layer, and arranged on the drift layer. The cell section further includes a vertical semiconductor element having: a second-conductivity-type layer arranged in the current dispersion layer with a striped pattern shape; a first electrode electrically connected to the second-conductivity-type layer; and a second electrode electrically connected to a back surface side of the substrate. The vertical semiconductor element flows a current between the first electrode and the second electrode. The guard ring section includes a plurality of linear guard rings having the second conductivity type with a linear frame shape, arranged to extend from a top surface of the current dispersion layer, and surrounding the cell section. The guard ring section includes a recessed portion provided by a concavity of the current dispersion layer deeper than the cell section, and the cell section protrudes from the guard ring section in a thickness direction of the substrate to provide a mesa portion with an island shape. The guard ring section further includes an electric field relaxation layer having the first conductivity type or the second conductivity type with a carrier concentration lower than the current dispersion layer and the guard rings, arranged in the current dispersion layer, and extending from a boundary position between the mesa portion and the recessed portion toward an outside of an outer periphery of the mesa portion.

According to an example embodiment, a method for manufacturing a silicon carbide semiconductor device including a cell section and an outer peripheral section having a guard ring section surrounding an outer periphery of the cell section, the method includes: preparing a substrate having a first conductivity type or a second conductivity type; forming a drift layer, having the first conductivity type with an impurity concentration lower than the substrate, on a top surface side of the substrate; forming a current dispersion layer, having the first conductivity type with an impurity concentration higher than the drift layer, on the drift layer; forming an electric field relaxation layer having the first conductivity type or the second conductivity type by ion-implanting an impurity having the second conductivity type into the current dispersion layer; forming a second-conductivity-type layer in the current dispersion layer in the cell section with a stripe pattern shape, and forming a plurality of guard rings, having the second conductivity type with a linear frame shape and surrounding the cell section, in the current dispersion layer in the guard ring section; forming a recessed portion, provided by a concavity of the current dispersion layer deeper than the cell section, in the guard ring section, and providing a mesa portion with an island shape by protruding the cell section from the guard ring section in a thickness direction of the substrate; forming a first electrode electrically connected to the second-conductivity-type layer; and forming a second electrode electrically connected to a back surface side of the substrate. In the forming of the electric field relaxation layer, the electric field relaxation layer having the first conductivity type or the second conductivity type with a carrier concentration lower than the current dispersion layer and the guard rings is formed to extend from a boundary-to-be-formed position between the mesa portion and the recessed portion toward an outside of an outer periphery of the mesa portion.

Thus, in the current dispersion layer in the guard ring section, the electric field relaxation layer is formed. Even when such an electric field relaxation layer is formed, it is possible to prevent an electric field from entering the space between the guard rings. Therefore, the same effects as obtained from the SiC semiconductor device according to the one aspect of the present disclosure described above can be obtained.

The following will describe the embodiments of the present disclosure on the basis of the drawings. Note that, in the following description of the individual embodiments, like or equivalent component parts are given like reference characters or numerals.

First Embodiment

A description will be given of a first embodiment. As an example of a power element including semiconductor elements, a SiC semiconductor device in which inversion-mode MOSFETs having trench gate structures will be described herein.

A SiC semiconductor device shown in FIG. 1 is configured to include a cell section in which the MOSFETs having the trench gate structures are formed and an outer peripheral section surrounding the cell section. The outer peripheral section is configured to include a guard ring section and a connecting section disposed internally of the guard ring section, i.e., between the cell section and the guard ring section. Note that FIG. 1 is not a cross-sectional view, but is partly shown with hatching for clarity of illustration.

Figure 2:
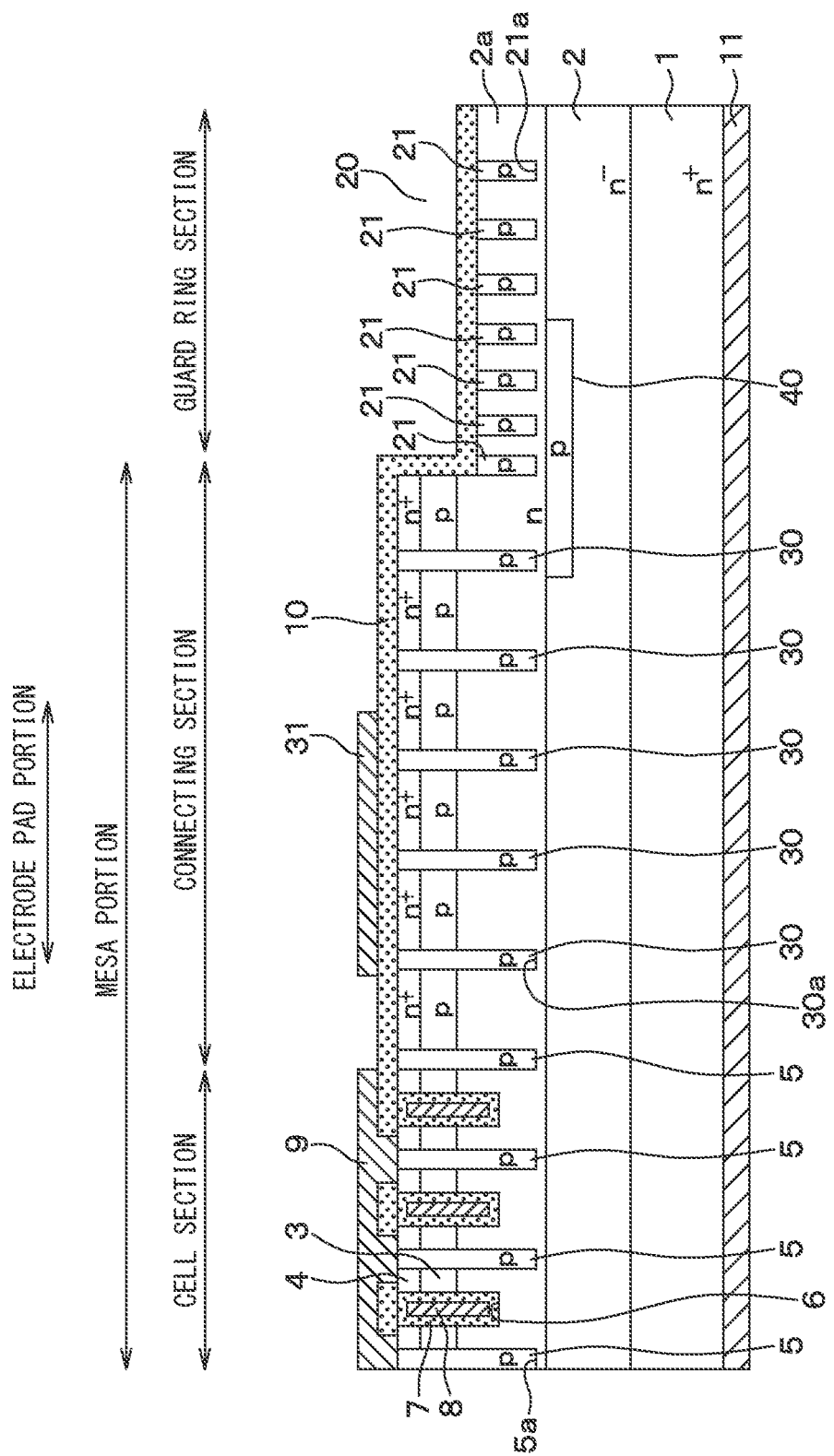
FIG. 2 is a cross-sectional view along the line II-II in FIG. 1.

As shown in FIG. 2, the SiC semiconductor device is formed using an n$^+$-type substrate 1 made of SiC. On the main surface of the n$^+$-type substrate 1, an n$^-$-type drift layer 2 made of SiC, an n-type current dispersion layer 2a, p-type base regions 3, and n$^+$-type source regions 4 are epitaxially grown in this order.

The n$^+$-type substrate 1 has an n-type impurity concentration of, e.g., $1.0 \times 10^{19}$/cm$^3$ and a (0001) Si plane as the top surface thereof. The n$^-$-type drift layer 2 has an n-type impurity concentration of, e.g., 0.5 to $2.0 \times 10^{16}$/cm$^3$. The n-type current dispersion layer 2a has an n-type impurity concentration higher than that of the n$^-$-type drift layer 2, i.e., a lower resistance. By allowing a current to flow dispersedly over a wider range, the n-type current dispersion layer 2a functions to reduce a JFET resistance. For example, the n-type current dispersion layer 2a has an n-type impurity concentration of, e.g., $8 \times 10^{16}$/cm$^3$ and a thickness of 0.5 μm.

Each of the p-type base regions 3 corresponds to a portion where a channel region is formed, and is configured to have a p-type impurity concentration of, e.g., about $2.0 \times 10^{17}$/cm$^3$ and a thickness of 300 nm. Each of the n$^+$-type source regions 4 is configured to have an impurity concentration higher than that of the n$^-$-type drift layer 2. For example, the surface layer portion of the n$^+$-type source region 4 has an n-type impurity concentration of $2.5 \times 10^{18}$ to $1.0 \times 10^{19}$/cm$^3$ and a thickness of about 0.5 μm.

In the cell section, on the top surface side of the n$^+$-type substrate 1, the p-type base regions 3 and the n$^+$-type source regions 4 are left. In the guard ring section, a recessed portion 20 is formed so as to extend through the n$^+$-type source regions 4 and the p-type base regions 3 and reach the n-type current dispersion layer 2a. By providing such a structure, a mesa structure is configured.

Also, in the cell section, p-type deep layers 5 are formed so as to extend through the n$^+$-type source regions 4 and the p-type base regions 3 and reach the n-type current dispersion layer 2a. Each of the p-type deep layers 5 has a p-type impurity concentration higher than that of each of the p-type base regions 3. Specifically, the plurality of p-type deep layers 5 are equidistantly arranged in the n-type current dispersion layer 2a and provided in trenches 5a in a striped pattern which are disposed to be spaced apart from each other with no point of intersection. Each of the p-type deep layers 5 is formed of a p-type epitaxial film which is epitaxially grown. Note that each of the trenches 5a corresponds to a deep trench and has e.g., a width of 1 μm or less and a depth corresponding to an aspect ratio of 2 or more.

For example, each of the p-type deep layers 5 is configured to have a p-type impurity concentration of $1.0 \times 10^{17}$/cm$^3$ to $1.0 \times 10^{19}$/cm$^3$, a width of 0.7 μm, and a depth of about 2.0 μm. Each of the p-type deep layers 5 has a deepest bottom portion located at the same position as a boundary position between the n-type current dispersion layer 2a and the n$^-$-type drift layer 2 or at a position closer to the p-type base region 3 than the boundary position. In other words, each of the p-type deep layers 5 and the n-type current dispersion layer 2a are formed at the same depth or, alternatively, the n-type current dispersion layer 2a is formed at a position deeper than that of the p-type deep layer 5. As shown in FIG. 1, each of the p-type deep layers 5 is formed to extend from one end of the cell section to the other end of the cell section. The p-type deep layers 5 are provided to extend in the same longitudinal directions as those of the trench gate structures described later and are connected to p-type connecting layers 30 described later. The p-type connecting layers 30 are provided to extend to the outside of the cell section beyond the both ends of the trench gate structures.

Each of the p-type deep layers 5 may extend in any direction but, when each of the p-type deep layers 5 extends in a <11-20> direction and the both facing wall surfaces forming the long sides of the trench 5a is allowed to have the same (1-100) plane, the p-type deep layer 5 is equally grown on the both wall surfaces of the trench 5a during burying epitaxial growth. This allows a uniform film quality to be obtained and also allows the effect of inhibiting a burying failure to be obtained.

In addition, gate trenches 6 each having, e.g., a width of 0.8 μm and a depth of 1.0 μm are formed so as to extend through the p-type base regions 3 and the n$^+$-type source regions 4 and reach the n$^-$-type drift layer 2. The p-type base regions 3 and the n$^+$-type source regions 4 each described above are disposed so as to come in contact with the side surfaces of the gate trenches 6. Each of the gate trenches 6 is formed to have a linear layout in which a lateral direction over the surface of a paper sheet with FIG. 2 corresponds to a width direction, a direction perpendicular to the paper sheet corresponds to a longitudinal direction, and a vertical direction over the paper sheet corresponds to a depth direction. As also shown in FIG. 1, the plurality of gate trenches 6 are disposed to be each interposed between the p-type deep layers 5 and are equidistantly arranged in parallel with each other into a striped pattern.

In addition, the portions of the p-type base regions 3 located on the side surfaces of the gate trenches 6 are used as the channel regions which connect the $n^+$-type source regions 4 and the $n^-$-type drift layer 2 during the operation of the vertical MOSFETs and, on the inner wall surfaces of the gate trenches 6 including the channel regions, gate insulating films 7 are formed. On the surfaces of the gate insulating films 7, gate electrodes 8 formed of doped Poly-Si are formed. With the gate insulating films 7 and the gate electrodes 8, the gate trenches 6 are filled up.

Over the respective top surfaces of the $n^+$-type source regions 4 and the p-type deep layers 5 and over the top surfaces of the gate electrodes 8, a source electrode 9 corresponding to a first electrode and a gate pad 31 disposed on an electrode pad portion are formed via an interlayer insulating film 10. Each of the source electrode 9 and the gate pad 31 is formed of a plurality of metals such as, e.g., Ni/Al. At least portions in contact with n-type SiC, specifically with the $n^+$-type source regions 4 and with the gate electrodes 8 when n-type doping is performed, are formed of a metal among the plurality of metals which can make ohmic contacts with the n-type SiC. Also, at least portions in contact with p-type SiC, specifically with the p-type deep layers 5, are formed of a metal among the plurality of metals which can make ohmic contacts with the p-type SiC. Note that the source electrode 9 and the gate pad 31 are electrically insulated from each other by being formed over the interlayer insulating film 10. Through the contact holes formed in the interlayer insulating film 10, the source electrode 9 is brought into electrical contact with the $n^+$-type source regions 4 and the p-type deep layers 5, while the gate pad 31 is brought into electrical contact with the gate electrodes 8.

On the back surface side of the $n^+$-type substrate 1, a drain electrode 11 corresponding to a second electrode is formed to be electrically connected to the $n^+$-type substrate 1. Such a structure forms the n-channel inversion-mode MOSFETs having the trench gate structures. Such MOSFETs are disposed as a plurality of cells to form the cell section.

On the other hand, in the guard ring section, as described above, the recessed portion 20 is formed so as to extend through the $n^+$-type source regions 4 and the p-type base regions 3 and reach the n-type current dispersion layer 2a. Thus, at a position away from the cell section, the $n^+$-type source regions 4 and the p-type base regions 3 are removed to expose the n-type current dispersion layer 2a. In the thickness direction of the $n^+$-type SiC substrate 1, a mesa portion is provided in which the cell section and the connecting section each located internally of the recessed portion 20 protrude into an island shape.

In the surface layer portion of the n-type current dispersion layer 2a located below the recessed portion 20, a plurality of p-type guard rings 21 are provided so as to surround the cell section. The number of the p-type guard rings 21 shown in FIG. 1 is 7. In the case of the present embodiment, each of the p-type guard rings 21 has a quadrilateral shape having four rounded corners. However, each of the p-type guard rings 21 may also be configured to have another frame shape such as a circular shape. The p-type guard rings 21 are disposed in individual trenches 21a formed in the n-type current dispersion layer 2a and each formed of a p-type epitaxial film which is epitaxially grown. Note that each of the trenches 21a corresponds to a guard ring trench and has, e.g., a width of 1 μm or less and a depth corresponding to an aspect ratio of 2 or more.

The individual components of each of the p-type guard rings 21 have the same configurations as those of the individual components of each of the p-type deep layers 5 described above. The p-type guard ring 21 is different from the linearly formed p-type deep layer 5 in that the upper surface of the p-type guard ring 21 has a frame-like linear shape surrounding the cell section and the connecting section, but is otherwise the same as the p-type deep layer 5. Specifically, the p-type guard ring 21 has the same width and the same thickness, i.e., the same depth as those of the p-type deep layer 5. The distances between the individual p-type guard rings 21 may be equal, but are smaller on the cell section side and gradually increase with approach to the outer periphery so as to reduce the electric field concentration on an inner peripheral side, i.e., on the cell section side and expand equipotential lines toward the outer periphery.

Note that, as necessary, an EQR structure may be provided on the outer peripheral side of the p-type guard rings 21 to form the guard ring section including an outer-peripheral breakdown-voltage-resistant structure surrounding the cell section.

In the connecting section extending from the cell section to the guard ring section, the plurality of p-type connecting layers 30 are formed in the surface layer portion of the $n^-$-type drift layer 2. In the case of the present embodiment, as shown by the broken-like hatching in FIG. 1, the connecting section is formed so as to surround the cell section, and the plurality of p-type guard rings 21 each having the quadrilateral shape having the four rounded corners are also formed to externally surround the connecting section. The plurality of p-type connecting layers 30 are disposed to be arranged in parallel with the p-type deep layers 5 formed in the cell section. In the present embodiment, the p-type connecting layers 30 are equally spaced apart at distances equal to the distances between the adjacent p-type deep layers 5. At a place where the distances from the cell section to the p-type guard rings 21 are large, the p-type connecting layers 30 are provided to extend from the p-type deep layers 5 so as to reduce the distances from the tip ends of the p-type connecting layers 30 to the p-type guard rings 21.

The p-type connecting layers 30 are disposed in individual trenches 30a extending through the $n^+$-type source regions 4 and the p-type base regions 3 and reaching the n-type drift layer 2. Each of the p-type connecting layers 30 is formed of a p-type epitaxial layer which is epitaxially grown. Between the cell section and the guard ring section in the longitudinal direction of the p-type deep layers 5, the p-type connecting layers 30 are formed in connected relation to the tip ends of the p-type deep layers 5. Note that each of the trenches 30a corresponds to a connecting trench and has, e.g., a width of 1 μm or less and a depth corresponding to an aspect ratio of 2 or more. Since the p-type connecting layers 30 are brought into contact with the p-type base regions 3, each of the p-type connecting layers 30 is fixed to a source potential.

The individual components of each of the p-type connecting layers 30 have the same configurations as those of the individual components of each of the p-type deep layers 5 and the p-type guard rings 21. The p-type connecting layer 30 is different from the p-type guard ring 21 formed in a frame shape in that the upper surface of the p-type connecting layer 30 has a linear shape, but is otherwise the same as the p-type guard ring 21. Specifically, the p-type connecting layer 30 has the same width and the same thickness, i.e., the same depth as those of the p-type deep layer 5 and the p-type guard ring 21. The distances between the individual p-type connecting layers 30 are equal to the distances between the p-type deep layers 5 in the cell section, but may also be different therefrom.

By forming the p-type connecting layers 30 described above and providing, between the individual p-type connecting layers 30, predetermined distances, e.g., distances equal to or smaller than the distances between the p-type deep layers 5, it is possible to prevent the equipotential lines from being excessively lifted up between the p-type connecting layers 30. This can prevent a portion where electric field concentration occurs from being formed between the p-type connecting layers 30 and prevent a breakdown voltage reduction.

Note that, at the both ends of each of the p-type connecting layers 30 in the longitudinal direction, i.e., at the both ends of each of the trenches 30a, the upper surface of the p-type connecting layer 30 has a semi-circular shape. The upper surface of the p-type connecting layer 30 at the both ends of the trench 30a may also have a quadrilateral shape but, when an n-type layer is formed first in an angular portion, the conductivity type may be inverted to an n-type. Accordingly, by forming the upper surface of the p-type connecting layer 30 at the both ends thereof into the semi-circular shape, it is possible to eliminate the portion where an n-type layer is formed.

In the connecting section also, over the top surfaces of the $n^+$-type source regions 4, the interlayer insulating film 10 is formed. The gate pad 31 described above is formed on the interlayer insulating film 10 in the connecting section.

Thus, a structure including the connecting section between the cell section and the guard ring section is provided, and the connecting section is configured to include the plurality of p-type connecting layers 30 buried in the narrow trenches 30a. If the trenches 30a are formed wider, the trenches 30a cannot be filled up, and consequently the thicknesses of the p-type connecting layers 30 may be reduced or the p-type connecting layers 30 may be partially lost when the p-type connecting layers 30 are etched back to be planarized. However, since the trenches 30a are thus configured to be narrower, the trenches 30a are appropriately filled up, and therefore it is possible to prevent a situation in which the thicknesses of the p-type connecting layers 30 are reduced or the p-type connecting layers 30 are partially lost. On the other hand, since the p-type connecting layers 30 have a multiply divided structure, the equipotential lines may be lifted up between the p-type connecting layers 30. However, by providing, between the individual p-type connecting layers 30, predetermined distances, e.g., distances equal to or smaller than the distances between the p-type deep layers 5, it is possible to prevent the equipotential lines from being excessively lifted up and prevent a breakdown voltage reduction.

Additionally, in the present embodiment, in the surface layer portion of the $n^-$-type drift layer 2, the electric field relaxation layer 40 is formed so as to extend from the connecting section and reach the guard ring section. The electric field relaxation layer 40 may appropriately be formed in at least a location in the guard ring section which is closer to the cell section and the connecting section, i.e., formed to extend from the boundary position between the mesa portion and the recessed portion 20 in a direction toward the outside of the outer periphery of the mesa portion. However, in the present embodiment, the electric field relaxation layer 40 is formed also in a location in the connecting section which is closer to the guard ring section. More specifically, the electric field relaxation layer 40 is formed in the entire region extending from a location in the guard ring section which is closer to the cell section and the connecting section to a location in the connecting section which is closer to the guard ring section to have a band-like frame shape surrounding at least the mesa portion. The p-type impurity concentration of the electric field relaxation layer 40 is set to, e.g., $0.5 \times 10^{17}/cm^3$, which is lower than the impurity concentrations of the p-type deep layers 5 and the p-type guard rings 21. The thickness of the electric field relaxation layer 40 is any and set to, e.g., about 0.5 μm.

As described above, with the miniaturization of the power element, the distances between the p-type guard rings 21 are reduced but, when the n-type current dispersion layer 2a is formed, it is possible to reduce the JFET resistance, while an electric field is likely to enter the space between the p-type guard rings 21. Accordingly, by reducing the distances between the p-type guard rings 21, it is intended to prevent an electric field from entering the space between the p-type guard rings 21 but, due to the resolution of photolithography in forming the trenches 21a in which the p-type guard rings 21 are disposed, there is a limit to the reduction of the distances.

However, by forming the electric field relaxation layer 40, it is possible to prevent an electric field from entering the space between the p-type guard rings 21. Note that the range in which the electric field relaxation layer 40 is formed in the guard ring section is basically determined on the basis of the distances at which the p-type guard rings 21 are spaced apart and the respective impurity concentrations of the p-type guard rings 21 and the n-type current dispersion layer 2a. Specifically, the p-type guard rings 21 are formed so as to reduce electric field concentration on the cell section side and further expand the equipotential lines to the outer peripheral side. However, depending on the distances at which the p-type guard rings 21 are spaced apart or the impurity concentrations of the p-type guard rings 21 and the n-type current dispersion layer 2a, the manner of the entrance of the electric field varies. Accordingly, the electric field relaxation layer 40 is formed so as to include a position which is assumed to reach the interlayer insulating film 10 formed thereover if the electric field relaxation layer 40 is not formed and when an electric field enters the space between the p-type guard rings 21.

The structure described above forms the SiC semiconductor device according to the present embodiment. In the SiC semiconductor device thus configured, when the MOSFET is turned ON, the voltage applied to each of the gate electrodes 8 is controlled to form the channel regions in the surface portions of the p-type base regions 3 located on the side surfaces of the gate trench 6. Thus, a current is allowed to flow between the source electrode 9 and the drain electrode 11 through the $n^+$-type source regions 4 and the $n^-$-type drift layer 2.

When the MOSFET is OFF, even though a high voltage is applied, the p-type deep layers 5 formed to extend to positions deeper than that of the trench gate structure prevent the entrance of an electric field into the bottom portion of the gate trench and reduce electric field concentration on the bottom portion of the gate trench. This can prevent the breakdown of the gate insulating film 7.

In addition, in the connecting section, the equipotential lines are prevented from being lifted up and are expanded toward the guard ring section. In the guard ring section, the p-type guard rings 21 allow the spaces between the equipotential lines to terminate, while being expanded in the direction toward the outer periphery. Consequently, in the guard ring section also, an intended breakdown voltage can be obtained.

Since the electric field relaxation layer 40 is provided at least in the location in the guard ring section which is closer to the connecting section, it is possible to prevent an electric field from entering the space between the p-type guard rings 21. This reduces electric field concentration, prevents the breakdown of the interlayer insulating film 10 due to electric field concentration, and can prevent a breakdown voltage reduction. As a result, it is possible to provide the SiC semiconductor device which allows an intended breakdown voltage to be obtained.

Subsequently, a description will be given of a production method for the SiC semiconductor device according to the present embodiment with reference to FIGS. 3A to 3H.

Figure 3A:
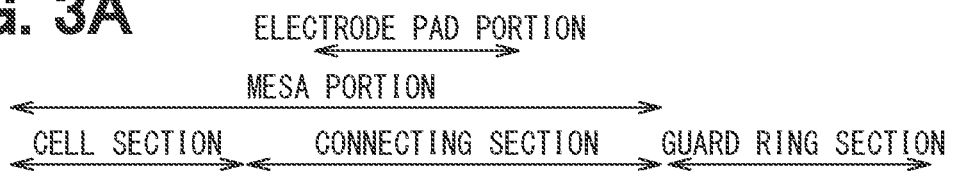
FIG. 3A is a cross-sectional view showing a production process of the SiC semiconductor device according to the first embodiment.
Figure 3A:
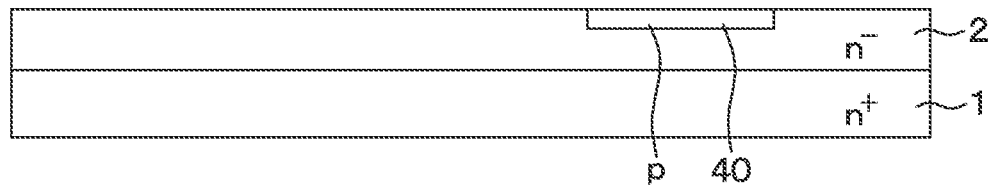

[Step Shown in FIG. 3A]

First, as a semiconductor substrate, the n$^+$-type substrate 1 is prepared. Then, on the main surface of the n$^+$-type substrate 1, the n$^-$-type drift layer 2 made of SiC is epitaxially grown. Then, using a mask not shown, a p-type impurity is ion-implanted into the surface layer portion of the n$^-$-type drift layer 2 and activation anneal is performed to form the electric field relaxation layer 40.

Note that the electric field relaxation layer 40 may appropriately be formed in at least a location in which the guard ring section is to be formed and which is closer to a location in which the connecting section is to be formed. The electric field relaxation layer 40 is formed herein so as to enter the location in which the connecting section is to be formed.

Figure 3B:
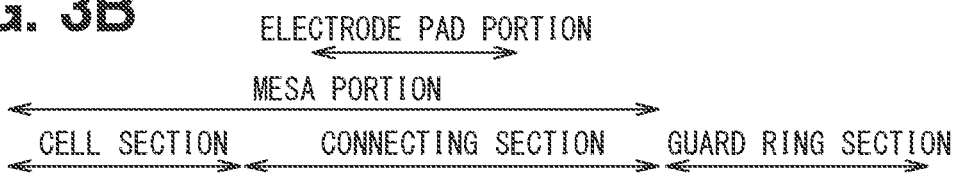
FIG. 3B is a cross-sectional view showing the production process of the SiC semiconductor device, which is subsequent to FIG. 3A.
Figure 3B:
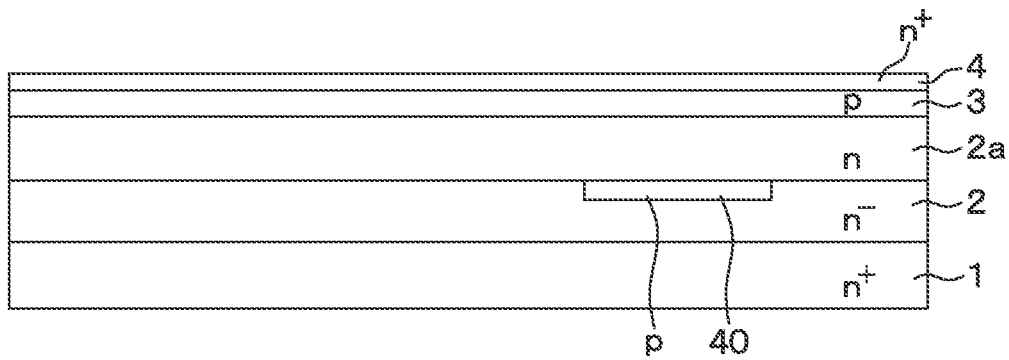

[Step Shown in FIG. 3B]

Subsequently, the mask is removed. Then, over the n$^-$-type drift layer 2 and the electric field relaxation layer 40, the n-type current dispersion layer 2a, the p-type base region 3, and the n$^+$-type source region 4 are epitaxially grown in this order.

Figure 3C:
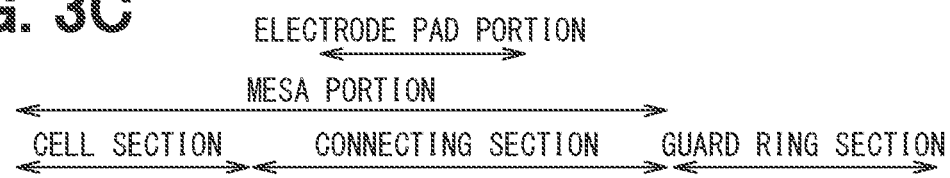
FIG. 3C is a cross-sectional view showing the production process of the SiC semiconductor device, which is subsequent to FIG. 3B.
Figure 3C:
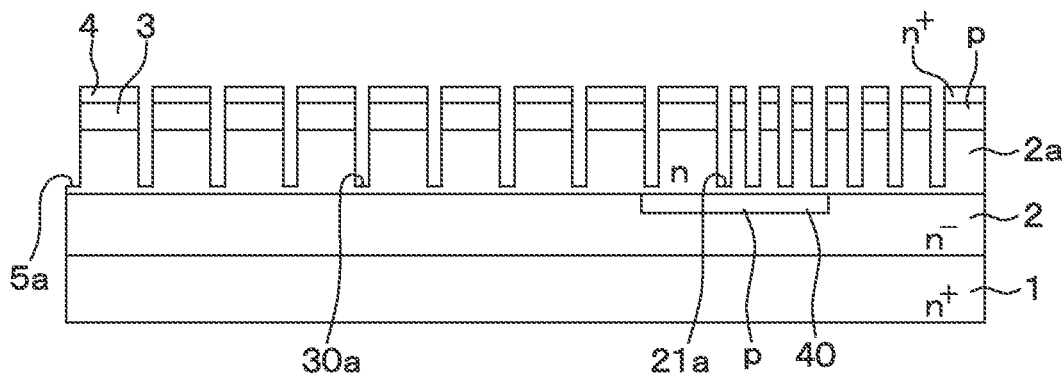

[Step Shown in FIG. 3C]

Next, a mask not shown is placed on the top surface of the n$^+$-type source region 4, and the portions of the mask corresponding to the regions where the p-type deep layers 5, the p-type guard rings 21, and the p-type connecting layers 30 are to be formed are opened. Then, using the mask, anisotropic etching such as RIE (Reactive Ion Etching) is performed to form the trenches 5a, 21a, and 30a.

At this time, as described above, the electric field relaxation layer 40 is formed not only in the location in which the guard ring section is to be formed and which is closer to the locations in which the cell section and the connecting section are to be formed, but also in the location in which the connecting section is to be formed and which is closer to the location in which the guard ring section is to be formed. As a result, even when the respective locations where the trenches 5a, 21a, and 30a are formed are displaced due to mask misalignment, the electric field relaxation layer 40 can reliably be disposed in at least the location in the guard ring section where the electric field relaxation layer 40 is intended to be formed. In addition, since the electric field relaxation layer 40 can be formed into the belt-like frame shape, a microfabrication process need not be performed, and the electric field relaxation layer 40 can easily be formed.

Figure 3D:
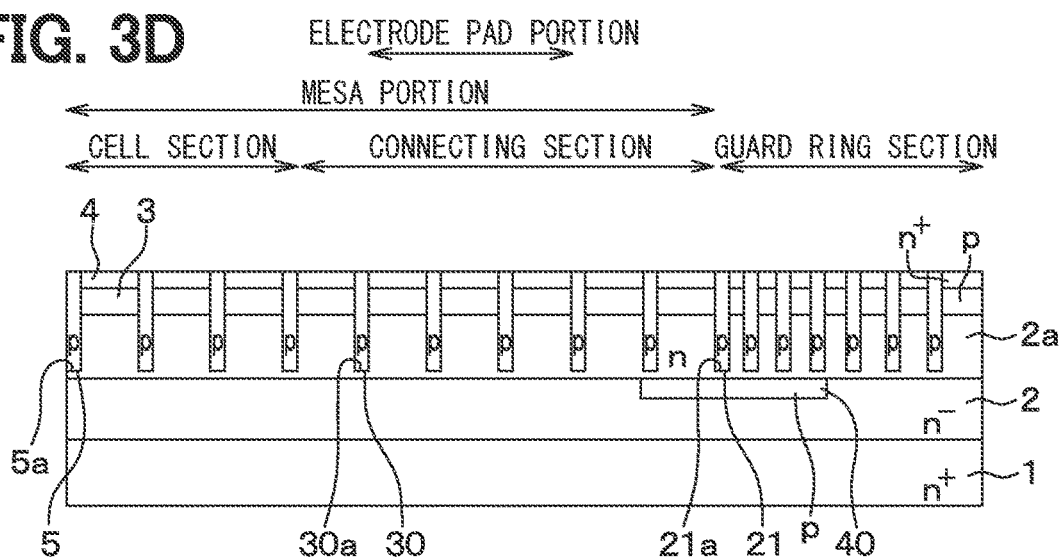
FIG. 3D is a cross-sectional view showing the production process of the SiC semiconductor device, which is subsequent to FIG. 3C.

[Step Shown in FIG. 3D]

After the mask is removed and a p-type layer is deposited, the portion of the p-type layer which is formed above the top surface of the n$^+$-type source region 4 is etched back to be removed and thus form the p-type deep layers 5, the p-type guard rings 21, and the p-type connecting layers 30.

At this time, by burying epitaxy, the p-type layer is buried in each of the trenches 5a, 21a, and 30a. However, since the trenches 5a, 21a, and 30a are formed to have equal widths, it is possible to inhibit the occurrence of an abnormal shape or roughness in the top surface of the p-type layer. This allows the p-type layer to be reliably buried in each of the trenches 5a, 21a, and 30a and provides the top surface of the p-type layer with a planar shape having reduced roughness.

During the etch-back process, the top surface of the p-type layer has a planar shape having reduced roughness so that the respective top surfaces of the p-type deep layers 5, the p-type guard rings 21, and the p-type connecting layers 30 are in a planar state. Consequently, when various processes for forming the trench gate structures are performed thereafter, intended gate shapes can be obtained. In addition, since the p-type layer is buried in each of the trenches 5a, 21a, and 30a, a problem such as a reduction in the thickness of each of the p-type connecting layers 30 does not arise.

Figure 3E:
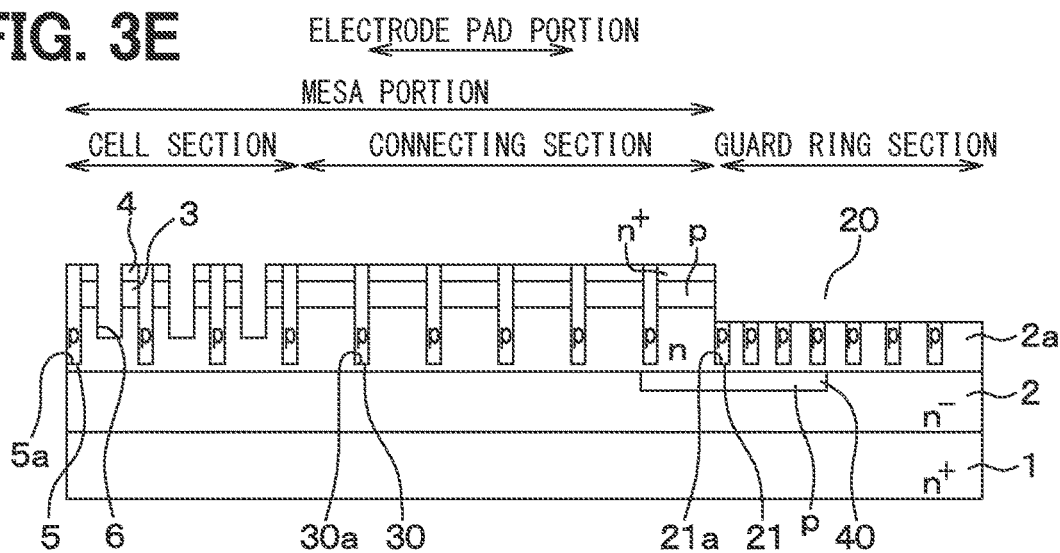
FIG. 3E is a cross-sectional view showing the production process of the SiC semiconductor device, which is subsequent to FIG. 3D.

[Step Shown in FIG. 3E]

After a mask not shown is formed on the n$^+$-type source regions 4 or the like, the portions of the mask corresponding to the regions where the gate trenches 6 are to be formed are opened. Then, using the mask, anisotropic etching such as RIE is performed to form the gate trenches 6.

After the mask is removed, a mask not shown is formed again, and the portion of the mask corresponding to the region where the recessed portion 20 is to be formed is opened. Then, using the mask, anisotropic etching such as RIE is performed to form the recessed portion 20. As a result, a structure is formed in which, in the location where the recessed portion 20 is formed, the n-type current dispersion layer 2a is exposed through the n$^+$-type source regions 4 and the p-type base regions 3, and the plurality of p-type guard rings 21 are disposed to extend from the top surface of the n-type current dispersion layer 2a.

Note that the gate trenches 6 and the recessed portion 20 are formed herein by the different steps using the different masks, but the gate trenches 6 and the recessed portion 20 can also be formed simultaneously using the same mask.

Figure 3F:
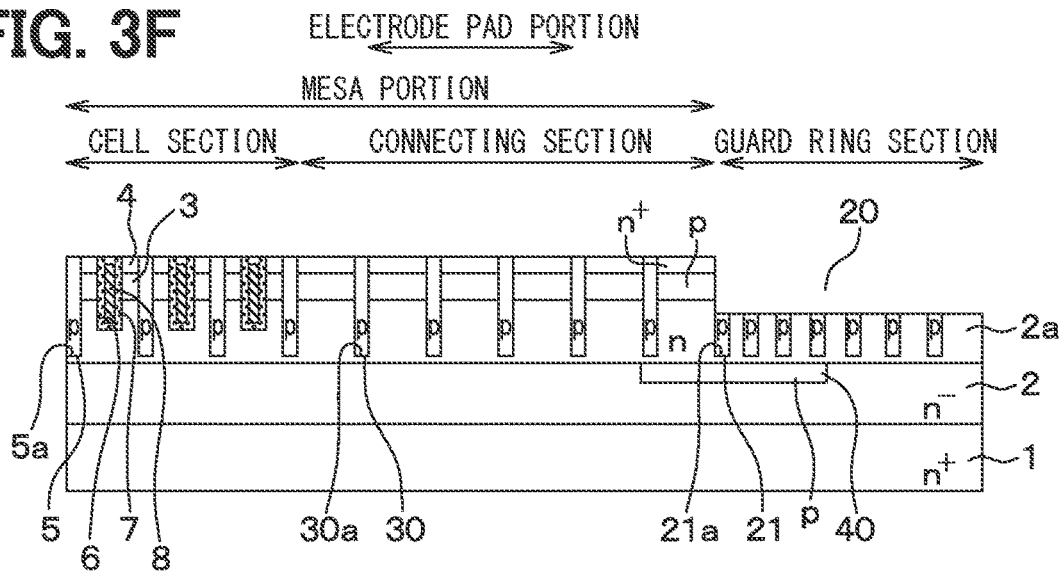
FIG. 3F is a cross-sectional view showing the production process of the SiC semiconductor device, which is subsequent to FIG. 3E.

[Step Shown in FIG. 3F]

After the mask is removed, e.g., thermal oxidation is performed to form the gate insulating films 7 and cover the inner wall surfaces of the gate trenches 6 and the top surfaces of the n$^+$-type source regions 4 with the gate insulating films 7. Then, Poly-Si doped with a p-type impurity or an n-type impurity is deposited and etched back to be left at least in the gate trenches 6 to form the gate electrodes 8.

Figure 3G:
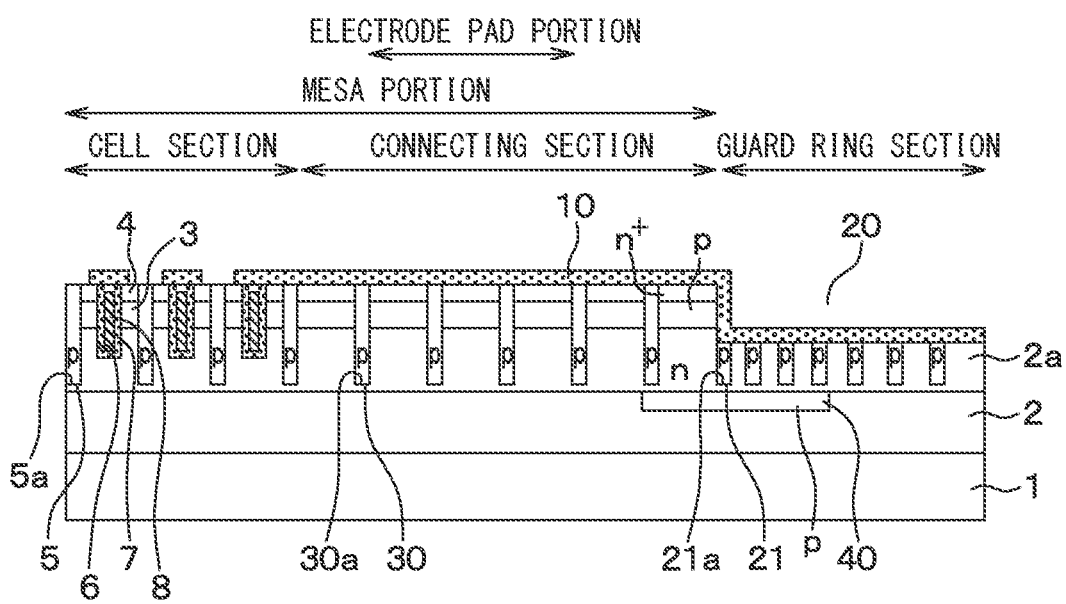
FIG. 3G is a cross-sectional view showing the production process of the SiC semiconductor device, which is subsequent to FIG. 3F.

[Step Shown in FIG. 3G]

The interlayer insulating film 10 formed of, e.g., an oxide film or the like is formed so as to cover the gate electrodes 8 and the top surfaces of the gate insulating films 7. Then, after a mask not shown is formed on the top surface of the interlayer insulating film 10, the portions of the mask located between the individual gate electrodes 8, i.e., the portions of the mask corresponding to the p-type deep layers 5 and the vicinities thereof are opened. Then, using the mask, the interlayer insulating film 10 is patterned to form the contact holes exposing the p-type deep layers 5 and the n$^+$-type source regions 4.

Figure 3H:
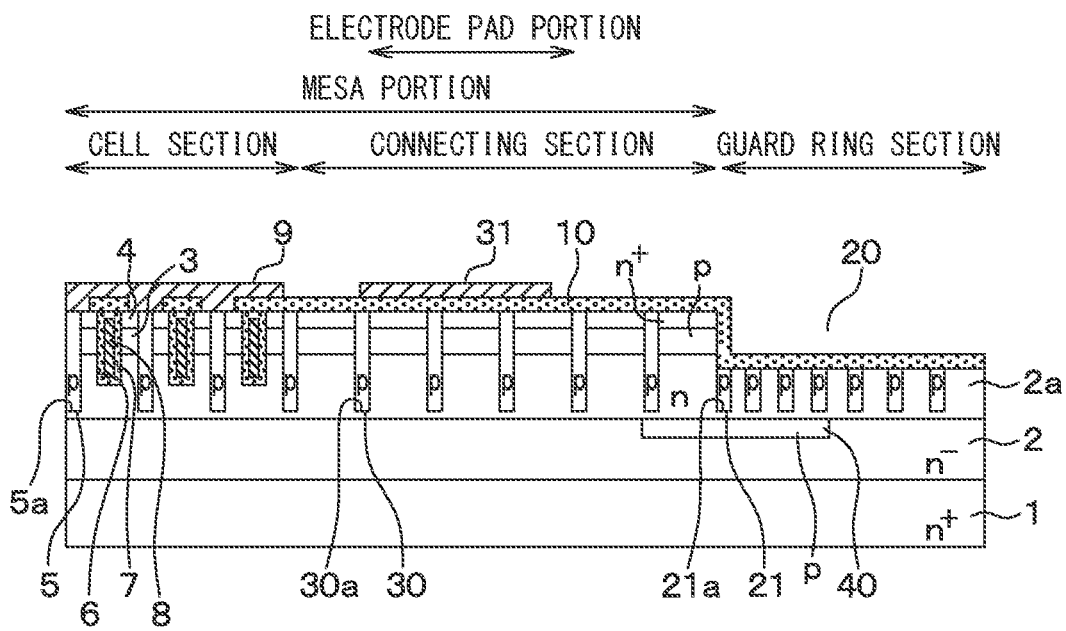
FIG. 3H is a cross-sectional view showing the production process of the SiC semiconductor device, which is subsequent to FIG. 3G.

[Step Shown in FIG. 3H]

On the top surface of the interlayer insulating film 10, an electrode material including a multi-layer structure in which, e.g., a plurality of metals are stacked is formed. Then, the electrode material is patterned to form the source electrode 9 and the gate pad 31. Note that, in a cross section different from that in FIG. 3H, gate lead-out portions connected to the gate electrodes 8 of the individual cells are provided. In the lead-out portions, the contact holes are opened in the interlayer insulating film 10 to provide electrical connection between the gate pad 31 and the gate electrodes 8.

The subsequent steps are not shown but, by performing the step of forming the drain electrode 11 on the back surface side of the n$^+$-type substrate 1 or the like, the SiC semiconductor device according to the present embodiment is completed.

As described above, in the present embodiment, in the surface layer portion of the n$^-$-type drift layer 2, the electric field relaxation layer 40 for electric field relaxation is formed so as to extend from the connecting section and reach the guard ring section. Thus, it is possible to prevent an electric field from entering the space between the p-type guard rings 21. This reduces electric field concentration, prevents the breakdown of the interlayer insulating film 10 resulting from electric field concentration, and can prevent a breakdown voltage reduction. Therefore, it is possible to provide the SiC semiconductor device which allows an intended breakdown voltage to be obtained.

Second Embodiment

A description will be given of a second embodiment. The present embodiment is obtained by changing the top layout of the electric field relaxation layer 40 in the first embodiment and is otherwise the same as the first embodiment. Accordingly, a description will be given only of a portion different from that in the first embodiment.

Figure 4:
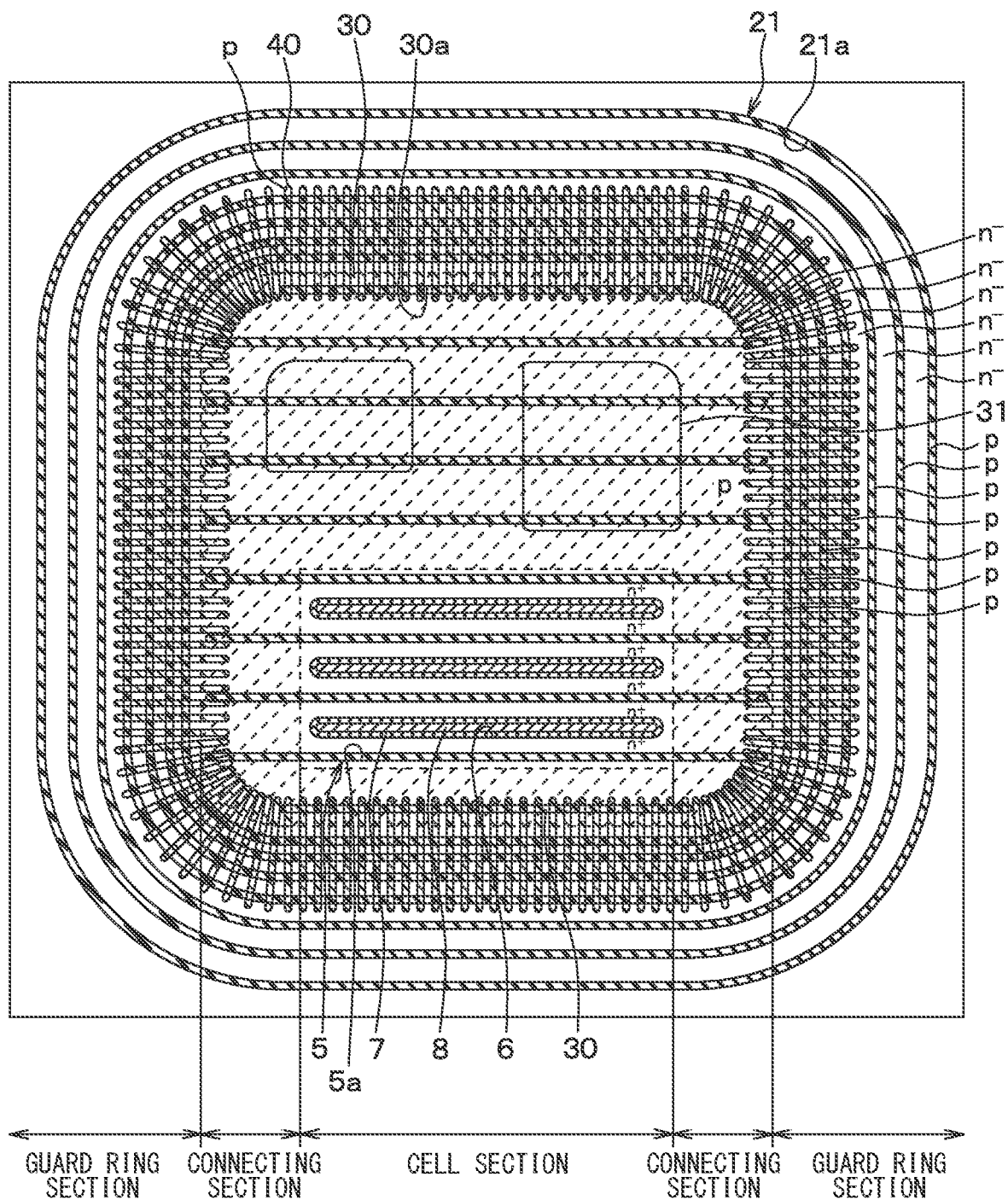
FIG. 4 is a view schematically showing a top layout of a SiC semiconductor device according to a second embodiment.

As shown in FIG. 4, in the present embodiment, the electric field relaxation layer 40 is provided in the form of a plurality of lines. More specifically, at the positions corresponding to the individual sides of the p-type guard rings 21 each having the quadrilateral shape having the four rounded corners, the electric field relaxation layers 40 are equidistantly provided to extend in the directions of normal lines to the individual sides. At the positions corresponding to the four corners, the electric field relaxation layers 40 are provided to extend from the center of the p-type guard rings 21 in a radial direction. In other words, the electric field relaxation layers 40 are disposed to be perpendicular to the p-type guard rings 21.

Even when the electric field relaxation layers 40 are thus disposed to be perpendicular to the p-type guard rings 21, the same effects as obtained in the first embodiment can be obtained.

In addition, since the area of the regions where the electric field relaxation layers 40 are formed is smaller than in the first embodiment, it is possible to effectively achieve electric field relaxation at a minimum p-type impurity dose and minimize a leakage current during the application of a high voltage due to an ion implantation defect.

Third Embodiment

A description will be given of a third embodiment. The present embodiment includes an impurity layer as a replacement for the electric field relaxation layer 40 described in each of the first and second embodiments. The third embodiment is otherwise the same as the first and second embodiment so that a description will be given only of a portion different from that in each of the first and second embodiments.

Figure 5:
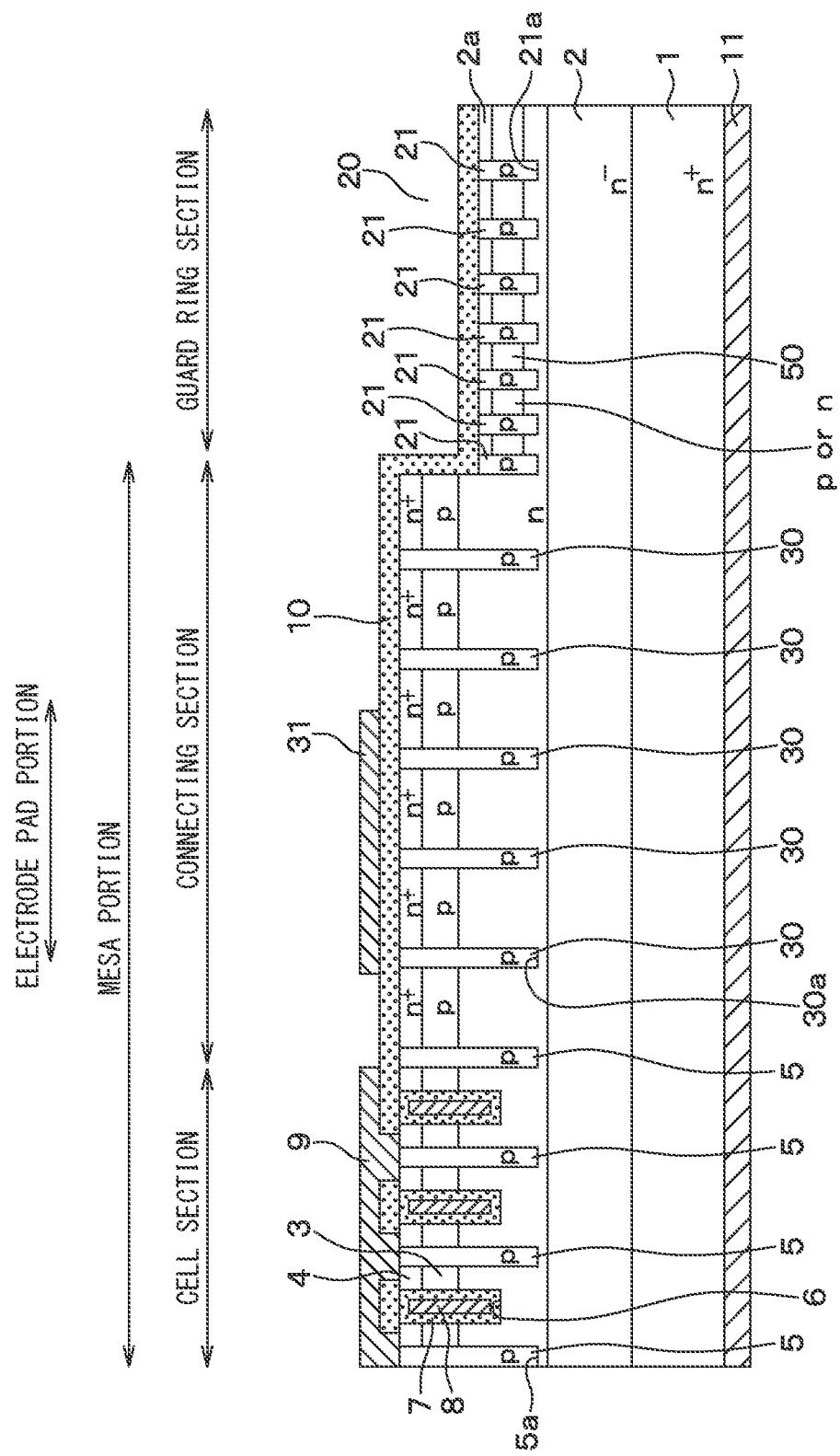
FIG. 5 is a cross-sectional view of a SiC semiconductor device according to a third embodiment.

As shown in FIG. 5, in the present embodiment, instead of the electric field relaxation layer 40, an electric field relaxation layer 50 is formed in the n-type current dispersion layer 2a in the guard ring section.

In the present embodiment, the electric field relaxation layer 50 is formed in the entire guard ring section. More specifically, in the guard ring section, the electric field relaxation layer 50 is formed in a frame body shape. The electric field relaxation layer 50 is formed of an n-type layer having a carrier concentration lower than that of the n-type current dispersion layer 2a or a p-type layer having a carrier concentration lower than that of each of the p-type guard rings 21. In other words, the absolute value of the difference between a donner concentration Nd and an acceptor concentration Na of the electric field relaxation layer 50 is set lower than the respective carrier concentrations of the n-type current dispersion layer 2a and the p-type guard rings 21 to satisfy, e.g., $|Nd-Na|<0.5\times10^{17}/cm^3$. The thickness of the electric field relaxation layer 50 is any and set to, e.g., about 0.5 μm.

Also, in the present embodiment, the electric field relaxation layer 50 is formed in the thickness range of the p-type guard rings 21, i.e., between the top surfaces of the p-type guard rings 21 closer to the interlayer insulating film 10 and the bottom surfaces of the p-type guard rings 21 closer to the n$^-$-type drift layer 2. However, the depth at which the electric field relaxation layer 50 is formed is appropriate as long as the upper surface of the electric field relaxation layer 50 closer to the interlayer insulating film 10 is at a position deeper than those of the top surfaces of the p-type guard rings 21 and shallower than the bottom surfaces of the p-type guard rings 21. In other words, the lower surface of the electric field relaxation layer 50 which is closer to the n$^-$-type drift layer 2 may also be at a position deeper than those of the bottom surfaces of the p-type guard rings 21.

Thus, in the guard ring section, the electric field relaxation layer 50 is formed in the n-type current dispersion layer 2a. Even when the electric field relaxation layer 50 described above is formed, it is possible to prevent an electric field from entering the space between the p-type guard rings 21. Accordingly, the same effects as obtained in the first and second embodiments can be obtained.

Next, a description will be given of a production method for the SiC semiconductor device in the present embodiment. Since the production method for the SiC semiconductor device in the present embodiment is substantially the same as the production method for the SiC semiconductor device shown in FIGS. 3A to 3H described in the first embodiment, the description will be given mainly of a different portion.

Figure 6A:
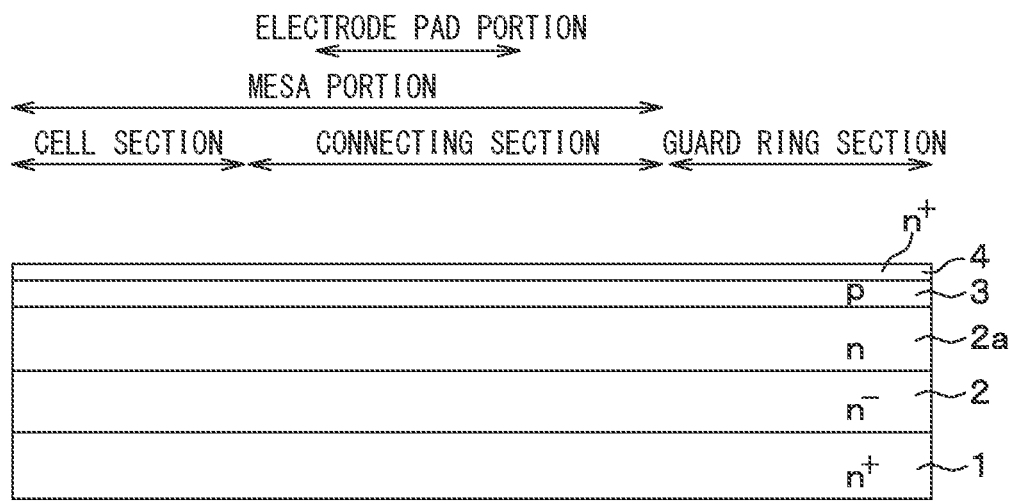
FIG. 6A is a cross-sectional view showing a production process of the SiC semiconductor device according to the third embodiment.

[Step Shown in FIG. 6A]

First, on the main surface of the n$^+$-type substrate 1, the n$^-$-type drift layer 2 made of SiC, the n-type current dispersion layer 2a, the p-type base region 3, and the n$^+$-type source region 4 are epitaxially grown in this order.

Figure 6B:
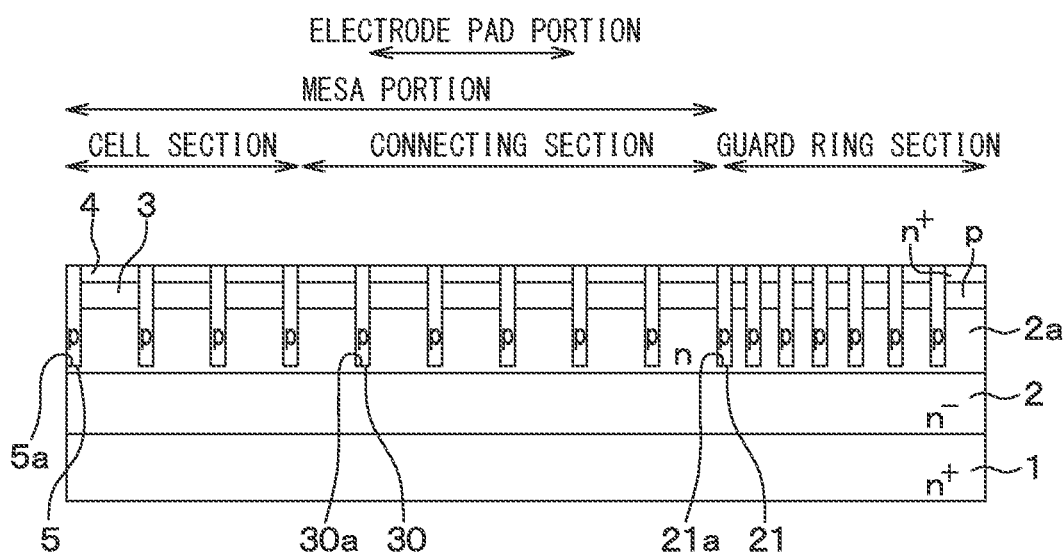
FIG. 6B is a cross-sectional view showing the production process of the SiC semiconductor device, which is subsequent to FIG. 6A.

[Step Shown in FIG. 6B]

Next, the same steps as shown in FIGS. 3C and 3D are performed to form the trenches 5a, 21a, and 30a, while forming the p-type deep layers 5, the p-type guard rings 21, and the p-type connecting layers 30 in the trenches 5a, 21a, and 30a.

Figure 6C:
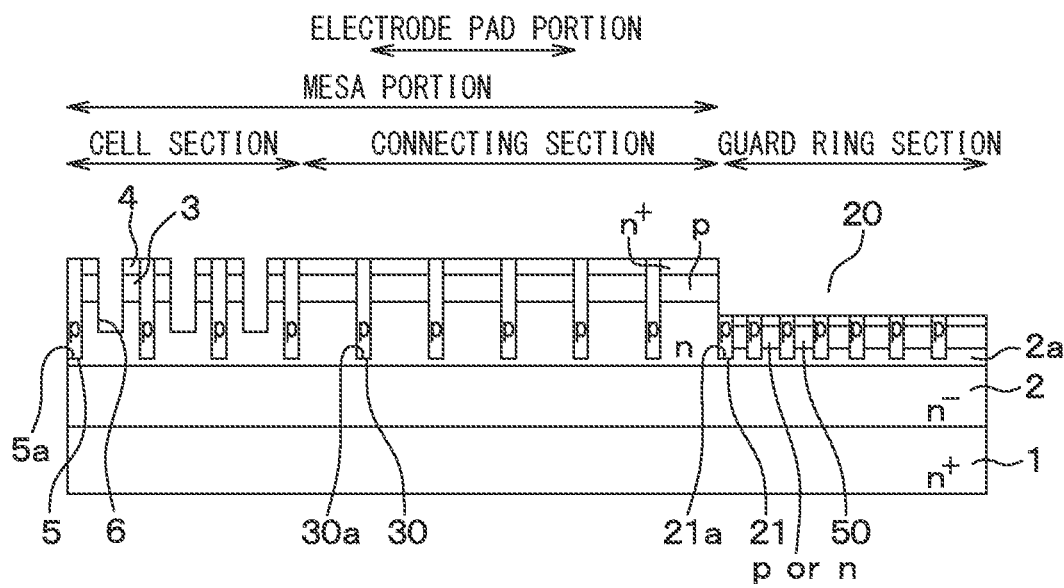
FIG. 6C is a cross-sectional view showing the production process of the SiC semiconductor device, which is subsequent to FIG. 6B.

[Step Shown in FIG. 6C]

A mask not shown is formed, and the portion of the mask corresponding to the region where the recessed portion 20 is to be formed is opened. Then, using the mask, anisotropic etching such as RIE is performed to form the recessed portion 20. As a result, a structure is formed in which, in the location where the recessed portion 20 is formed, the n-type current dispersion layer 2a is exposed through the n+-type source regions 4 and the p-type base regions 3, and the plurality of p-type guard rings 21 are disposed in the surface layer portion of the n-type current dispersion layer 2a.

Then, using again the mask used during the formation of the recessed portion 20, an n-type impurity is ion-implanted and activation anneal is subsequently performed to form the electric field relaxation layer 50 in the recessed portion 20. At this time, the dose of the n-type impurity is adjusted such that the absolute value of the difference between the donner concentration Nd and the acceptor concentration Na of the electric field relaxation layer 50 satisfies $|Nd-Na|<0.5\times10^{17}/cm^3$. Then, the mask used during the formation of the recessed portion 20 and during the formation of the electric field relaxation layer 50 is removed, and subsequently the step of forming the gate trenches 6, which is included in the step shown in FIG. 3D, is performed.

Figure 6D:
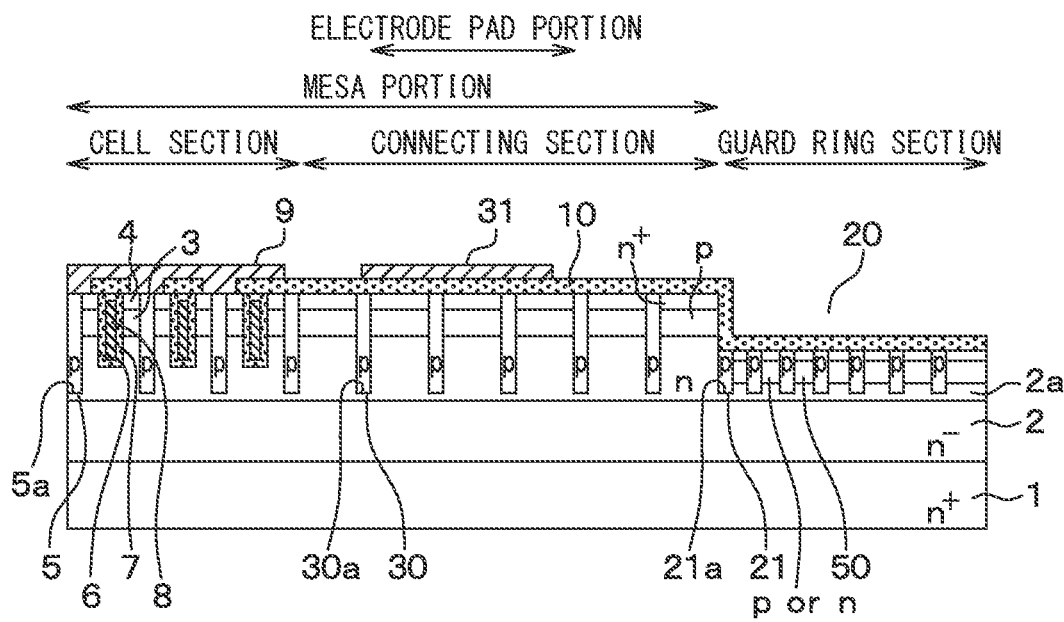
FIG. 6D is a cross-sectional view showing the production process of the SiC semiconductor device, which is subsequent to FIG. 6C.

[Step Shown in FIG. 6D]

Then, the individual steps including and subsequent to the step shown in FIG. 3E are further performed. This allows the SiC semiconductor device in the present embodiment to be produced.

Modifications of Third Embodiment

Figure 7:
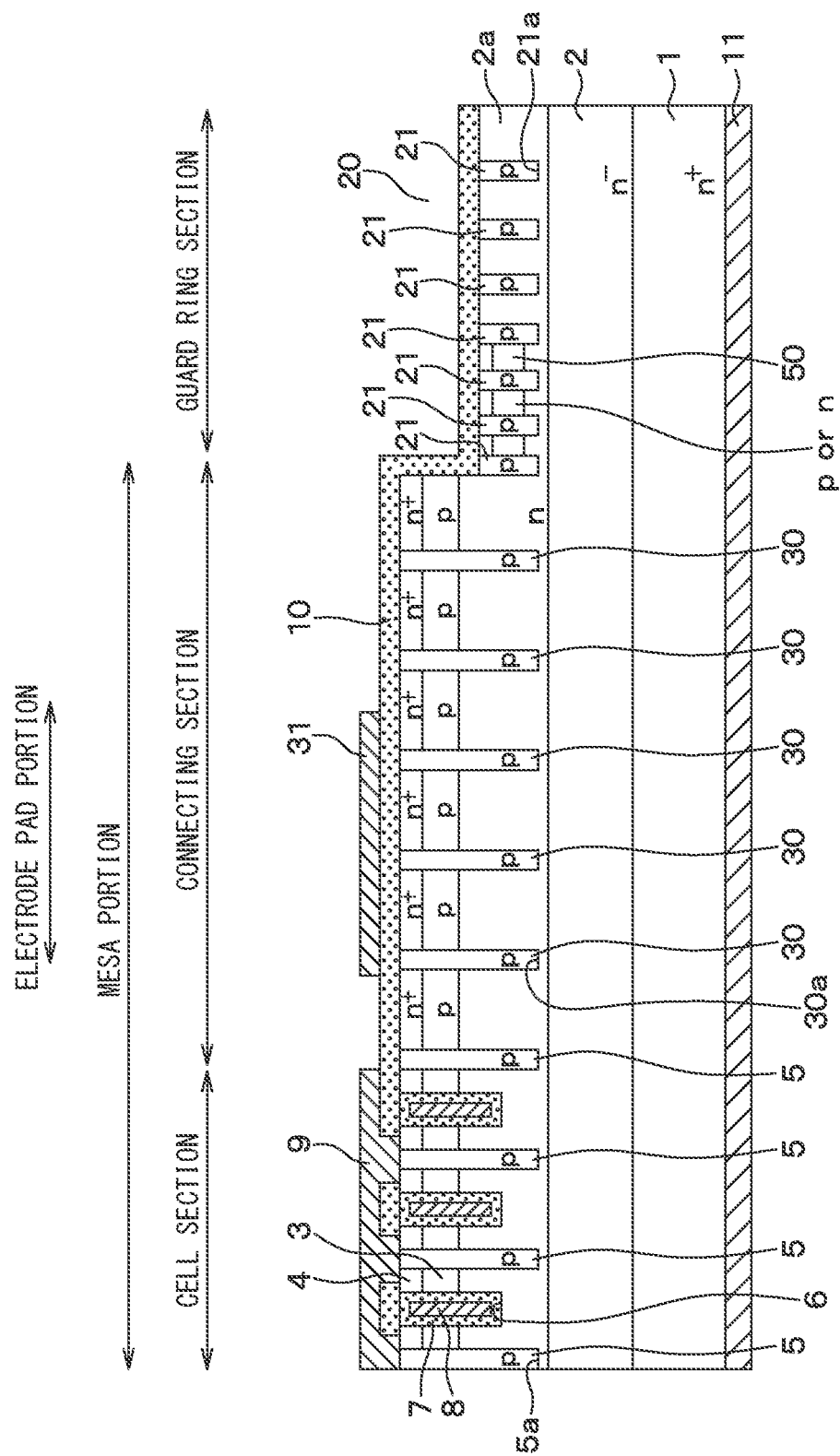
FIG. 7 is a cross-sectional view of a SiC semiconductor device described in a modification of the third embodiment.

The electric field relaxation layer 50 described above in the third embodiment need not be formed in the entire guard ring section. For example, as shown in FIG. 7, it may also be possible to form the electric field relaxation layer 50 only in the location in the guard ring section which is closer to the cell section and to the connecting section. Alternatively, the electric field relaxation layer 50 may also be formed to extend to the location in the connecting section which is closer to the guard ring section.

However, to provide such a structure, it is necessary to perform ion implantation for forming the electric field relaxation layer 50 using another mask other than the mask used when the recessed portion 20 is formed, e.g., a resist mask.

Note that, when the electric field relaxation layer 50 is formed only in the location in the guard ring section which is closer to the cell section and to the connecting section, the hatched range of the electric field relaxation layer 50 is determined on the basis of the distances at which the p-type guard rings 21 are spaced apart and the respective impurity concentrations of the p-type guard rings 21 and the n-type current dispersion layer 2a. As described above, the p-type guard rings 21 are formed so as to reduce electric field concentration on the cell section side and allow the equipotential lines to be further expanded to the outer peripheral side. Depending on the distances at which the p-type guard rings 21 are spaced apart and the respective impurity concentrations of the p-type guard rings 21 and the n-type current dispersion layer 2a, the manner of the entrance of the electric field varies. Accordingly, the electric field relaxation layer 50 is formed so as to include a position which is assumed to reach the interlayer insulating film 10 formed thereover if the electric field relaxation layer 50 is not formed and when an electric field enters the space between the p-type guard rings 21.

Other Embodiments

It is to be understood that the present disclosure has been described in accordance to the embodiments described above, but the present disclosure is not limited to the embodiments. The present disclosure also encompasses variations in the equivalent range as various modifications. In addition, embodiments and various combinations, and further, only one element thereof, less or more, and the form and other combinations including, are intended to fall within the spirit and scope of the present disclosure.

(1) In each of the embodiments described above, the n+-type source regions 4 are epitaxially grown in succession over the p-type base regions 3. However, the n+-type source regions 4 may also be formed by ion-implanting an n-type impurity into intended locations in the p-type base regions 3.

(2) In each of the embodiments described above, the description has been given using the n-channel inversion-mode MOSFET having the trench gate structure as an example of the vertical power element. However, each of the embodiments has shown only an example of the vertical semiconductor element. A vertical semiconductor element having another structure or another conductivity type may also be used as long as a current is allowed to flow between a first electrode provided on the top surface side of a semiconductor substrate and a second electrode provided on the back surface side of the semiconductor substrate.

For example, in the first embodiment described above or the like, the description has been given using, as an example, the n-channel MOSFET in which the n-type is the first conductivity type and the p-type is the second conductivity type. However, a p-channel MOSFET in which the conductivity types of the individual components are inverted may also be used instead. Also, in the description given above, the MOSFET is used as an example of the semiconductor element. However, the present disclosure is also applicable to an IGBT having a similar structure. The IGBT is obtainable by merely changing the conductivity type of the n+-type substrate 1 in each of the embodiments described above from the n-type to the p-type, and other structures and a production method therefor are the same as in each of the embodiments described above. The description has also been given using the MOSFET having the trench gate structure as an example of the vertical MOSFET, but the vertical MOSFET is not limited to the MOSFET having the trench gate structure, and a planar-type MOSFET may also be used instead.

Not only a power element having a MOS structure, but also a Schottky diode may also be used appropriately. Specifically, the Schottky diode is formed such that an n−-type drift layer is formed on the main surface of an n+-type substrate, a Schottky electrode corresponding to the first electrode is formed on the n−-type drift layer, and an ohmic electrode corresponding to the second electrode is formed on the back surface side of the n+-type substrate. In such a structure, a plurality of p-type deep layers are formed to extend from the surface layer portion of the n−-type drift layer to form a junction barrier Schottky diode (hereinafter referred to as JBS). By also providing, in a SiC semiconductor device including such a JBS, the electric field relaxation layer 40 described in the first and second embodiments or the electric field relaxation layer 50 described in the third embodiment, the same effects as obtained in each of the embodiments described above can be obtained.

(3) In each of the foregoing embodiments, the p-type deep layers 5, the p-type guard rings 21, and the p-type connecting layers 30 are formed by burying epitaxial growth. However, the p-type deep layers 5, the p-type guard rings 21, and the p-type connecting layers 30 may also be formed by ion implantation.

(4) In each of the embodiments described above, the p-type deep layers 5 and the p-type connecting layers 30 are formed to extend through the $n^+$-type source regions 4 and the p-type base regions 3. However, the p-type deep layers 5 and the p-type connecting layers 30 may also be formed only below the p-type base regions 3.

(5) When a crystal orientation is shown, a bar (-) should originally be placed over an intended number. However, since there is a limit to expression due to electronic filing, in the present description, it is assumed that a bar is placed before an intended number.

What is claimed is:

1. A silicon carbide semiconductor device comprising:
a cell section; and
an outer peripheral section including a guard ring section surrounding an outer periphery of the cell section, wherein:
each of the cell section and the outer peripheral section includes:
a substrate having a first conductivity type or a second conductivity type;
a drift layer having the first conductivity type, arranged on a top surface side of the substrate, and having an impurity concentration lower than the substrate; and
a current dispersion layer having the first conductivity type, arranged on the drift layer, and having an impurity concentration higher than the drift layer;
the cell section further includes a vertical semiconductor element having:
a second-conductivity-type layer arranged in the current dispersion layer with a stripe pattern shape;
a first electrode electrically connected to the second-conductivity-type layer; and
a second electrode electrically connected to a back surface side of the substrate;
the vertical semiconductor element flows a current between the first electrode and the second electrode;
the guard ring section includes a plurality of guard rings having the second conductivity type with a linear frame shape, arranged to extend from a top surface of the current dispersion layer, and surrounding the cell section;
the guard ring section includes a recessed portion provided by a concavity of the current dispersion layer deeper than the cell section, and the cell section protrudes from the guard ring section in a thickness direction of the substrate to provide a mesa portion with an island shape;
the guard ring section further includes an electric field relaxation layer having the second conductivity type with an impurity concentration lower than the guard rings, arranged in a surface layer portion of the drift layer, and extending from a boundary position between the mesa portion and the recessed portion toward an outside of an outer periphery of the mesa portion, and
the electric field relaxation layer is arranged under at least two of the guard rings without contacting the at least two of the guard rings,
wherein the electric field relaxation layer further extends from the boundary between the mesa portion and the recessed portion toward an inside of the mesa portion.

2. The silicon carbide semiconductor device according to claim 1, wherein:
the electric field relaxation layer has a belt frame shape surrounding the mesa portion.

3. The silicon carbide semiconductor device according to claim 1, wherein:
the cell section includes a vertical semiconductor element having:
a base region having the second conductivity type and arranged on the current dispersion layer;
a source region having the first conductivity type with an impurity concentration higher than the drift layer, and arranged on the base region;
a trench gate structure having a gate insulation film and a gate electrode arranged on the gate insulating film, the gate insulating film being arranged in a gate trench disposed to extend from a top surface of the source region to a position deeper than the base region, and being disposed on an inner wall of the gate trench;
the second-conductivity-type layer arranged in another trench disposed to extend to a position deeper than the gate trench;
a source electrode electrically connected to the source region and the base region to provide the first electrode; and
a drain electrode electrically connected to a back surface side of the substrate to provide the second electrode.

4. The silicon carbide semiconductor device according to claim 1, wherein
the electric field relaxation layer is configured to prevent an electric field from entering a space between the plurality of guard rings.

5. The silicon carbide semiconductor device according to claim 1, wherein
the electric field relaxation layer is disposed under at least two of the plurality of guard rings.

6. A method for manufacturing a silicon carbide semiconductor device including a cell section and an outer peripheral section having a guard ring section surrounding an outer periphery of the cell section, the method comprising:
preparing a substrate having a first conductivity type or a second conductivity type;
forming a drift layer, having the first conductivity type with an impurity concentration lower than the substrate, on a top surface side of the substrate;
forming an electric field relaxation layer having the second conductivity type by ion-implanting an impurity having the second conductivity type into a surface layer portion of the drift layer;
forming a current dispersion layer, having the first conductivity type with an impurity concentration higher than the drift layer, on the drift layer;
forming a second-conductivity-type layer in the current dispersion layer in the cell section with a stripe pattern shape, and forming a plurality of guard rings, having the second conductivity type with a linear frame shape and surrounding the cell section, in the current dispersion layer in the guard ring section;
forming a recessed portion, provided by a concavity of the current dispersion layer deeper than the cell section, in the guard ring section, and providing a mesa portion with an island shape by protruding the cell section from the guard ring section in a thickness direction of the substrate;

forming a first electrode electrically connected to the second-conductivity-type layer; and forming a second electrode electrically connected to a back surface side of the substrate, wherein:

in the forming of the electric field relaxation layer, the electric field relaxation layer is formed to extend from a boundary-to-be-formed position between the mesa portion and the recessed portion toward an outside of an outer periphery of the mesa portion, the electric field relaxation layer is arranged under at least two of the guard rings without contacting the at least two of the guard rings, and in the forming of the electric field relaxation layer, the electric field relaxation layer further extends from the boundary between the mesa portion and the recessed portion toward an inside of the mesa portion.

7. The method for manufacturing the silicon carbide semiconductor device according to claim 6, further comprising:

forming a base region having the second conductivity type on the current dispersion layer;

forming a source region having the first conductivity type with an impurity concentration higher than the drift layer on the base region;

anisotropic etching on a top surface of the source region to form a plurality of trenches including a deep trench in the cell section and a plurality of guard ring trenches in the guard ring section;

epitaxially growing a silicon carbide layer having the second conductivity type to fill up each of the deep trench and the guard ring trenches, and then removing a portion of the silicon carbide layer disposed over the source region by an etch-back process to form the second-conductivity-type layer in the deep trench and to form the guard rings in the guard ring trenches; and forming a trench gate structure in the cell section, the trench gate structure including a gate trench extending from the top surface of the source region to a position deeper than the base region, a gate insulating film disposed on an inner wall of the gate trench, and a gate electrode disposed on the gate insulating film, wherein:

in the forming of the first electrode, a source electrode as the first electrode is formed to be electrically connected to the source region and the base region; and in the forming of the second electrode, a drain electrode as the second electrode is formed on the back surface side of the substrate.

8. The method for manufacturing the silicon carbide semiconductor device according to claim 6, wherein the electric field relaxation layer is configured to prevent an electric field from entering a space between the plurality of guard rings.

9. The method for manufacturing the silicon carbide semiconductor device according to claim 6, wherein the electric field relaxation layer is disposed under at least two of the plurality of guard rings.

* * * * *